United States Patent [19]

Beasom

[11] 4,120,707

[45] Oct. 17, 1978

[54] PROCESS OF FABRICATING JUNCTION ISOLATED IGFET AND BIPOLAR TRANSISTOR INTEGRATED CIRCUIT BY DIFFUSION

[75] Inventor: James D. Beasom, Melbourne, Fla.

[73] Assignee: Harris Corporation, Cleveland, Ohio

[21] Appl. No.: 782,694

[22] Filed: Mar. 30, 1977

[51] Int. Cl.² .................. H01L 27/02; H01L 21/225; H01L 21/20; H01L 29/72

[52] U.S. Cl. .................................... 148/186; 148/1.5; 148/189; 357/43; 357/47

[58] Field of Search .................... 148/189, 1.5, 186; 357/43, 47

[56] References Cited

U.S. PATENT DOCUMENTS

| 3,798,079 | 3/1974 | Chu et al. | 148/33.5 |
|---|---|---|---|
| 3,865,649 | 2/1975 | Beasom | 148/187 |
| 4,032,956 | 6/1977 | Yagi et al. | 357/37 |

OTHER PUBLICATIONS

H. Yagi et al., "A Novel Bipolar ... Low Emitter Impurity Conc. ...", Tech. Digest 1974, Int. Electr. Device Meet., Wash.

De Graaff et al., "Some Aspects of LEC Transistor ...", Solid State Electr. 19, (1976) 809.

Primary Examiner—L. Dewayne Rutledge
Assistant Examiner—Upendra Roy
Attorney, Agent, or Firm—Leitner, Palan, Martin & Bernstein

[57] ABSTRACT

A high voltage junction isolated integrated circuit having complementary insulated gate field effect and PNP transistors wherein low impurity gradient and concentration N-type source and drain regions of the N-channel device and base region of the PNP are formed in even lower impurity gradient and concentration P-type body regions and collector region respectively which are in an N-substrate.

The process includes diffusing P-type regions in said N-type substrate to form a low impurity gradient and concentration body and collector, diffusing N-type regions in said P-type regions to form a low impurity gradient and concentration source, drain and base, diffusing P-type regions in said N-type base region to form a high impurity gradient and concentration emitter and in said substrates to form a high impurity gradient and concentration source and drain, and diffusing N-type regions in said N-type base, source and drain regions to form high impurity gradient and concentration contacts.

14 Claims, 4 Drawing Figures

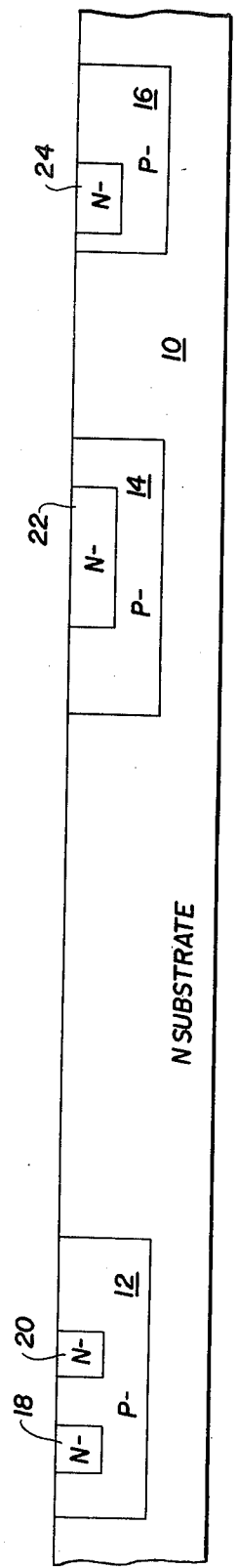
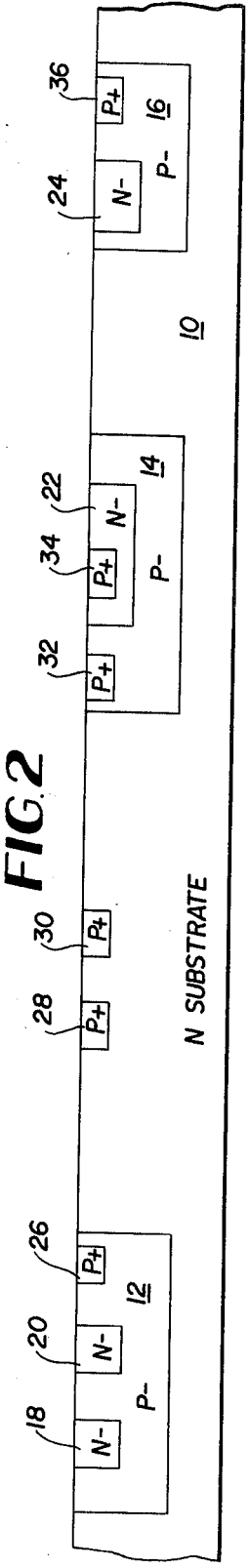
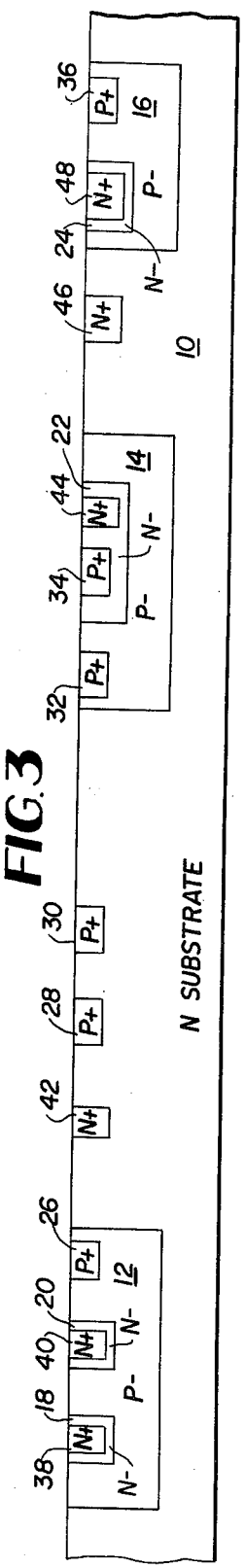
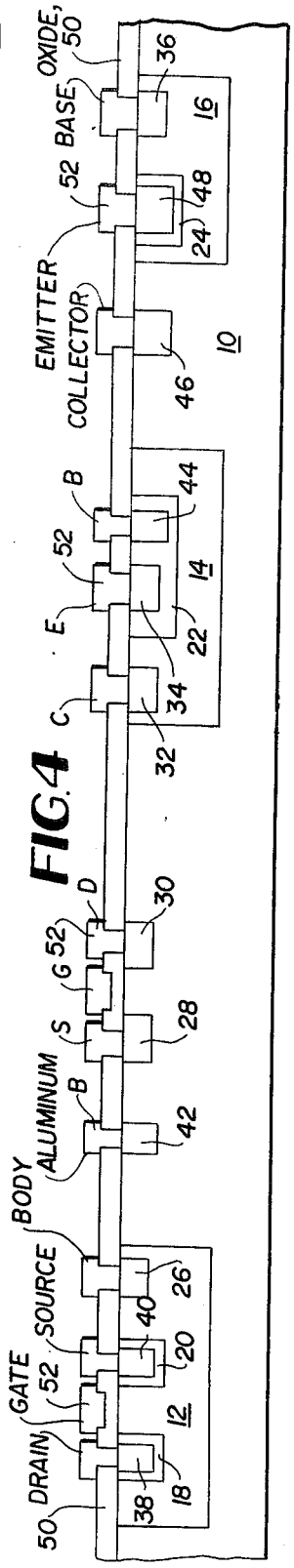

PROCESS OF FABRICATING JUNCTION ISOLATED IGFET AND BIPOLAR TRANSISTOR INTEGRATED CIRCUIT BY DIFFUSION

BACKGROUND OF THE INVENTION

1. Field of the Invention

The present invention relates generally to integrated circuits and more particularly to high power, voltage isolated integrated circuits having IGFET and bipolar transistors therein.

2. Description of the Prior Art

Insulated gate field effect transistors (IGFET), and especially metal oxide field effect transistors (MOS) are very desirable elements in integrated circuits because of their low power dissipation and relatively simple fabrication. However, the low transconductance and limited current capacity of MOS devices preclude their use in many applications. Addition of bipolar transistors in junction isolated circuits with IGFETs have been used to decrease the switching time and as protective devices. The junction isolated integrated circuits of the prior art, including IFGETs and bipolar transistors, do not provide devices with high breakdown voltages, i.e., breakdown voltages greater than 30 volts. Similarly, the process of fabrication in these prior art isolated integrated circuits have generally been quite complex and expensive. Thus there exists a need for a junction isolated integrated circuit having IGFETs and bipolar transistors with high breakdown voltages and which may be fabricated using a minimum number of processing steps.

SUMMARY OF THE INVENTION

The present invention optimizes the number of steps needed to fabricate a junction isolated integrated circuit having IGFETs and bipolar transistors with high breakdown voltages.

The process of fabrication includes four simple diffusion steps to produce completely junction isolated complementary insulated gate field effect transistors and at least a PNP bipolar transistor having high breakdown voltages. The process of fabrication begins with diffusing P-type impurities into a low impurity concentration N-type substrate to form a body region and a collector region having a low impurity gradient and concentration. Next, N-type impurities are diffused into the P-type body region to form source and drain regions and into the P-type collector region to form a base region, each region having a low impurity gradient and concentration, but higher than said P-type regions. A third diffusion of P-type impurities is performed to form source and drain regions in the N-type substrate and an emitter region in the N-type base region, each region having a high impurity gradient and concentration. Finally, N-type impurities are diffused into the N-type base, source and drain regions to form high impurity gradient and concentration contact regions therein.

The impurity gradient and concentration of the diffused regions are progressively larger than the regions into which they are diffused such that the doping concentration on the more lightly doped side of a PN junction is lower or the gradient of the impurity at the junction is low. The relationship of the impurity gradient in the area of the junction or the impurity concentration of the lighter doped side of a PN junction provide the high breakdown voltage of the devices of the present invention.

The second P-type diffusion may also form contact regions in the P-type base and body regions and the second N-type diffusion may form a body contact in the substrate. Additionally, an NPN transistor may also be formed wherein the first P-type diffusion forms a base region in the substrate acting as a collector, the first N-type diffusion forms an emitter region in the P-type base, the second P-type diffusion forms a base contact in the base region and the second N-type diffusion forms emitter and collector contacts in the emitter and substrate respectively.

OBJECTS OF THE INVENTION

An object of the present invention is to provide a method of fabricating an integrated circuit having IGFETs and bipolar transistors of high breakdown voltage.

A further object is to provide a junction isolated integrated circuit having IGFETs and bipolar transistors of high breakdown voltage.

A further object of the present invention is to provide a four step diffusion process for fabricating complementary IGFETs and bipolar transistors which have high breakdown voltages.

Other objects, advantages and novel features of the present invention will become apparent from the following detailed description of the invention when considered in conjunction with the accompanying drawings.

BRIEF DESCRIPTION OF THE DRAWINGS

FIGS. 1 through 4 are cross-sectional views of the integrated circuit structures at successive stages of development in the fabrication of an integrated circuit embodying the present invention.

DESCRIPTION OF THE PREFERRED EMBODIMENTS

Referring to FIG. 1, a monocrystalline substrate 10 is shown as being N-type having a resistance of, for example, 4 ohm centimeters and an impurity concentration of approximately $1 \times 10^{15}$ atoms per cubic centimeter. The process begins by introducing P-type impurities, for example, boron, into the substrate at sufficient temperature and for a sufficient period to form low impurity gradient P$^-$ body region 12, collector region 14, and base region 16. Regions 12, 14 and 16 have a depth of approximately 12 microns, a sheet resistance of approximately 550 ohms per square and a low impurity gradient at the bottom of the junction of $7.7 \times 10^{18}$ atoms per centimeter$^4$ with a surface impurity concentration of $1 \times 10^{17}$ atoms per cubic centimeter. The diffusion takes place through a mask formed by well-known techniques, for example, forming a layer of masking material, for example, silicon dioxide, on the substrate, providing a photoresistive material thereon, developing the photoresistive material to form openings in the masking material, and removing the masking material by etching to form the openings. After the diffusion, a new mask may be applied and delineated to perform the subsequent diffusions. Since the formation of a mask is well-known, no details of any specific masking technique need be explained in detail. The remaining three diffusions also take place through masks formed on the surface of the substrate.

The second diffusion introduces N-type impurities into body region 12 to form spaced N$^-$ low impurity gradient drain and source regions 18 and 20, into collector region 14 to form N⁻ low impurity gradient base region 22, and into base region 16 to form N⁻ low impurity gradient emitter region 24. Regions 18, 20, 22, and 24, may be formed using N-type impurities, for example, phosphorus, diffused at a sufficient temperature and for a sufficient period to a depth of 6 microns and resulting sheet resistance of approximately 90 ohms per square and a low impurity gradient at the bottom of the junction of $3.5 \times 10^{20}$ atoms per centimeter$^4$ having a surface of impurity concentration of $1 \times 10^{18}$ atoms per cubic centimeter. The wafer at this point in the fabrication is illustrated in FIG. 1.

The third diffusion is then performed using a P-type impurities to form P⁺ high impurity gradient body contact region 26 in body region 12 of an N channel device, source and drain regions 28 and 30 in the substrate for a P channel device, collector contact region 32 in collector region 14, emitter region 34 in base region 22 and base contact region 36 in base region 16. The P-type impurities may be, for example, boron, diffused at a sufficient temperature and for a sufficient time to a depth of 3 microns and resulting in sheet resistance of approximately 4 ohms per square and a high impurity gradient at the bottom of the junction of $8.6 \times 10^{<a}$ toms per centimeter$^4$ with a surface impurity concentration of $4 \times 10^{20}$ atoms per cubic centimeter. The resulting structure is illustrated in FIG. 2.

The fourth and final diffusion introduces N-type impurities into drain and source regions 18 and 20 to form N⁺ high impurity gradient contact regions 38 and 40, into substrate 10 adjacent source and drain regions 28 and 30 to form N⁺ high impurity gradient body contact region 42, into the base region 22 to form N⁺ high impurity gradient base contact region 44, into a substrate 10 adjacent base region 16 to form N⁺ high impurity gradient collector contact region 46 and into emitter region 24 to form N⁺ high impurity gradient contact region 48. The N-type impurity may be, for example, phosphorus, diffused at a sufficient temperature and for a sufficient time to a depth of 3.6 microns and resulting in a sheet resistance of approximately 1.5 ohms per square and a high impurity gradient at the bottom of the junction of $2 \times 10^{22}$ atoms per centimeter$^4$ with a surface impurity concentration of $1 \times 10^{21}$ atoms per cubic centimeter. This final structure is shown in FIG. 3.

After the fourth diffusion, a 1,300 angstrom gate oxide 50 is grown over the substrate. Then, contact apertures are formed in the oxide layer 50 and metallic layer 52, for example, aluminum, is evaporated on the wafer pattern to form the MOS gates and interconnects. This structure, as illustrated in FIG. 4, is an integrated circuit having fully junction isolated complementary insulated gate field effect and a PNP transistors and a not fully isolated NPN transistor all having high breakdown voltages.

The process of the present invention using four diffusion steps, wherein the first diffusion forms a 550 ohms per square, 12 microns deep regions, the second diffusion forms 90 ohms per square, 6 microns deep regions, the third diffusion forms 4 ohms per square, 3 microns deep regions, and the fourth diffusion forms 1.5 ohms per square, 3.6 microns deep regions, produced devices having the following characteristics:

$V_{T_{NMOS}} = 2.5V$
$V_{T_{PMOS}} = 2.7V$
$H_{FE_{PNP}} = 50$
$BV_{CEO_{PNP}} = 48V$
$H_{FE_{NPN}} = 65$
$BV_{CEO_{NPN}} = 90V$
$BV_{DSS_{NMOS}} = 47V$
$BV_{DSS_{PMOS}} = 36V$
$BV_{CBO_{PNP}} = 53V$
$BV_{EBO_{PNP}} = 11.7V$
$BV_{CBO_{NPN}} = 230V$
$BV_{EBO_{NPN}} = 54V$

The process steps may be altered such that the second P-type and second N-type diffusions are performed in reverse order if desired. Similarly, the emitter region of the NPN transistor may be formed during the second N-type diffusion resulting in region 48 alone, thus eliminating region 24. The NPN transistor may be eliminated completely if so desired. Although the IGFETs are illustrated as MOS devices, any insulated gate field effect transistor may be formed. The gate material may be a semiconductor material or multi-layered, for example, using silicon nitride layer and a metal layer thereon.

The essence of the present invention is the relationship of the impurity gradients and impurity concentrations to produce the high breakdown voltage devices. At the junctions formed by the first P-type diffused regions and the N substrate, a low impurity gradient of both regions at the junction and a lightly doped substrate both result in a high breakdown voltage. For the junctions between the first N-type diffused regions and the first P-type diffused regions, the low impurity gradient near the junction of both regions produce a high breakdown voltage resulting from using a relatively large junction depth for the first N-type diffusion and by making the resistivity of that diffusion relatively high. The first N-type diffusion must also be of relatively high resistivity to obtain good emitter efficiency, and therefore, acceptably high $H_{FE}$ for the PNP. At the junction formed by the second P-type diffused regions and the substrate and the first N-type diffused regions, the light impurity concentration of the N-type regions produce a high breakdown in spite of the high impurity gradient of the second P-type diffused regions.

Beginning with the requirement that the contact regions of the devices must have a surface concentration of at least $1 \times 10^{19}$ carriers per cubic centimeter and that the first P- and N-type diffused regions should have low impurity gradients the first P-type diffused regions could have a surface impurity concentration in the range of $1 \times 10^{16}$ to $1 \times 10^{18}$ atoms per cubic centimeter, the first N-type diffused regions have a surface impurity concentration in the range of $5 \times 10^{16}$ to $2 \times 10^{19}$ atoms per cubic centimeter and the N-type substrates have a surface impurity concentration in the range of $5 \times 10^{13}$ to $5 \times 10^{15}$ atoms per cubic centimeter.

From the preceding description of the preferred embodiments, it is obvious that the objects of the invention are obtained and that a junction isolated integrated circuit having complementary IGFETs and bipolar transistors of high breakdown voltages is produced. Although the invention has been described and illustrated in detail, it is to be clearly understood that the same is by way of illustration and example only and not to be taken by way of limitation. The spirit and scope of this invention is to be limited only by the terms of the appended claims.

What is claimed:

1. A process for fabricating junction isolated, integrated circuits including bipolar and insulated gate field effect transistors in a surface of an N-type substrate without forming junction isolation regions comprising the steps of:
diffusing impurities into said surface to form spaced P-type body region and collector region in said substrate, said P-type regions having a first surface impurity concentration and a first depth sufficient to produce a low impurity gradient;
diffusing impurities into said surface to form spaced N-type source and drain regions in said P-type body region and base region in said P-type collector region, said N-type regions having a second surface impurity concentration and a second depth sufficient to produce a lower impurity gradient at junction with said P-type regions;
diffusing impurities into said surface to form spaced P-type source and drain regions in said N-type substrate and an emitter region in said N-type base region; and
diffusing impurities into said surface to form N-type contact regions in said N-type base, source and drain regions.

2. The process of claim 1 wherein said second P-type diffusion also forms contact regions in said P-type body and collector regions and said second N-type diffusion also forms a body contact region in said substrate adjacent said P-type source and drains.

3. The process of claim 1 wherein:
said first P-type diffusion also forms a base region in said N-type substrate,
said first N-type diffusion also forms an emitter region in said P-type base region;
said second P-type diffusion also forms a contact region in said P-type base; and
said second N-type diffusion also forms a collector contact region in said substrate adjacent said P-type base region and contact region in said N-type emitter region.

4. The process of claim 1 wherein said first surface impurity concentration is approximately $1 \times 10^{17}$ atoms per cubic centimeter and said first depth is approximately twelve microns.

5. The process of claim 1 wherein said second surface impurity concentration is approximately $1 \times 10^{18}$ atoms per cubic centimeter and said second depth is approximately six microns.

6. The process of claim 1 wherein said first surface impurity concentration is sufficiently larger than the impurity concentration of said substrate to form a high breakdown voltage junction therewith.

7. The process of claim 6 wherein said substrate has an impurity concentration of approximately $1 \times 10^{15}$ atoms per cubic centimeter and said first surface impurity concentration is approximately $1 \times 10^{17}$ atoms per cubic centimeter.

8. A process for fabricating junction isolated, integrated circuits including bipolar and insulated gate field effect transistors in an N-type substrate without forming junction isolation regions comprising the steps of:
diffusing impurities into a surface of said substrate to form spaced P-type body region and collector region in said substrate, having high breakdown voltage junctions with said substrate;
diffusing impurities into said surface to form spaced N-type source and drain regions in said P-type body region and base region in said P-type collector region, having a high breakdown voltage junctions therewith;
diffusing impurities into said surface to form spaced P-type source and drain regions in said N-type substrate and an emitter region in said N-type base region having a high breakdown voltage junctions therewith;
diffusing impurities into said surface to form spaced P-type source and drain regions in said N-type substrate and an emitter region in said N-type base region having a high breakdown voltage junction therewith; and
diffusing impurities into said surface to form N-type contact regions in said N-type base, source and drain regions.

9. The process of claim 8 wherein said first P-type and N-type diffusion forms regions of a depth and impurity concentration sufficient to produce regions having a low impurity gradient.

10. The process of claim 8 wherein said second P-type diffusion also forms contact regions in said P-type body and collector regions and said second N-type diffusion also forms a body contact region ion said substrate adjacent said P-type source and drains.

11. The process of claim 8 wherein:
said first P-type diffusion also forms a base region in said N-type substrate;
said first N-type diffusion also forms an emitter region in said P-type base region;
said second P-type diffusion also forms a contact region in said P-type base; and
said second diffusion also forms a collector contact region in said substrate adjacent base P-type base region and contact region in said N-type emitter region.

12. The process of claim 9 wherein said first P-type diffusion forms P-type regions having a surface impurity concentration of approximately $1 \times 10^{17}$ atoms per cubic centimeter and a depth of approximately 12 microns.

13. The process of claim 12 wherein said first N-type diffusion forms N-type regions having a surface impurity concentration of approximately $1 \times 10^{18}$ atoms per cubic centimeter and a depth of approximately 6 microns.

14. The process of claim 12 wherein said substrate has an impurity concentration of approximately $1 \times 10^{15}$ atoms per cubic centimeter.

* * * * *

UNITED STATES PATENT AND TRADEMARK OFFICE
CERTIFICATE OF CORRECTION

PATENT NO. : 4,120,707

DATED : October 17, 1978

INVENTOR(S) : James D. Beasom

It is certified that error appears in the above-identified patent and that said Letters Patent are hereby corrected as shown below:

Column 3, lines 24, delete ">" and insert therefor --21--.

Column 3, line 36, delete "46" and insert therefor --56--.

Column 5, line 14, delete "lower" and insert therefor --low--.

after "at" insert --the--.

Column 6, delete lines 17-21.

Column 6, line 32, delete "ion" and insert therefor --in--.

Column 6, line 41, after "second" insert --N-type--.

Signed and Sealed this

Third Day of April 1979

[SEAL]

Attest:

RUTH C. MASON
Attesting Officer

DONALD W. BANNER
Commissioner of Patents and Trademarks